United States Patent [19]

Nishida et al.

[11] Patent Number: 5,314,734
[45] Date of Patent: May 24, 1994

[54] INFORMATION-RECORDING MEDIUM

[75] Inventors: Tetsuya Nishida, Hachioji; Shinkichi Horigome, Tachikawa, both of Japan

[73] Assignees: Hitachi, Ltd., Tokyo; Hitachi Maxell, Ltd., Ibaraki, both of Japan

[21] Appl. No.: 15,854

[22] Filed: Feb. 10, 1993

[30] Foreign Application Priority Data

Feb. 10, 1992 [JP] Japan ................................. 4-023566

[51] Int. Cl.$^5$ ............................................. B32B 3/02
[52] U.S. Cl. ........................................ 428/64; 428/65; 428/689; 428/699; 428/913; 430/945; 369/275.2; 346/76 L; 346/135.1
[58] Field of Search .............. 428/64, 65, 689, 699, 428/913; 430/945; 369/275.2; 346/76 L, 135.1

[56] References Cited

U.S. PATENT DOCUMENTS

| | | | |
|---|---|---|---|
| 4,668,573 | 5/1987 | Terao et al. | 428/336 |
| 4,866,672 | 9/1989 | Terao et al. | |
| 4,954,379 | 9/1990 | Nishida et al. | 428/64 |
| 5,011,723 | 4/1991 | Harigaya et al. | 428/64 |
| 5,095,479 | 3/1992 | Harigaya et al. | 369/288 |
| 5,100,700 | 3/1992 | Ide et al. | 428/64 |

FOREIGN PATENT DOCUMENTS

57-24039 2/1982 Japan.
61-171389 8/1986 Japan.

Primary Examiner—Patrick J. Ryan
Assistant Examiner—Marie R. Macholl
Attorney, Agent, or Firm—Antonelli, Terry, Stout & Kraus

[57] ABSTRACT

An information recording medium which is superior in record/read-out characteristics, high in sensitivity and good in stability can be provided at a low cost by using, as an information-recording medium in which recording is carried out due to change in atomic arrangement upon irradiation with a laser beam, an information-recording medium comprising substrates 1, 1', recording layers 2, 2' changing in atomic arrangement upon irradiation with a recording energy beam, and reflective layers which are provided contiguous to the recording layers and the recording layer has an average composition represented by $A_wD_xSb_ySe_z$ (wherein w, x, y and z are in the ranges of $0 \leq w \leq 30$, $3 \leq x \leq 57$, $3 \leq y \leq 57$ and $40 \leq z \leq 90$ in atomic percent, D represents at least one element of Sn, In, Ge, Pb, Si, Bi, Ga, Au, Ag and Cu and A represents an element other than Sb, Se, the elements represented by D and rare gases).

25 Claims, 2 Drawing Sheets

INFORMATION-RECORDING MEDIUM

BACKGROUND OF THE INVENTION

The present invention relates to an information-recording medium which can make real-time recording of digital information such as an analogue signal, for example, an image or a sound which has been subjected to frequency modulation, data of electronic computers, a facsimile signal, a digital audio signal or the like by using recording energy beams such as laser beams and electron rays.

There are various principles of carrying out recording in thin films by laser beams and the like. Among them, the recording by changing of atomic arrangement such as phase-transition (also called phase change) of materials of the recording layer, diffusion of atoms between layers of a thin film or photo-darkening has the advantage that double-sided disks made by direct lamination of two disks can be realized because this recording involves substantially no deformation of the thin film. Many applications have been filed on the inventions relating to the recording of this kind. That is, with reference to the phase-transition of materials in the recording layer, Japanese Patent Kokai (Laid-Open) No.57-24039 discloses thin films of $Sb_{25}Te_{12.5}Se_{62.5}$, $Cd_{14}Te_{14}Se_{72}$, $Bi_2Se_3$, $Sb_2Se_3$, $In_{20}Te_{20}Se_{60}$, $Bi_{25}Te_{12.5}Se_{62.5}$, CuSe and $Te_{33}Se_{67}$. Japanese Patent Kokai (Laid-Open) No.61-171389 and U.S. Pat. No. 4,866,672 make mention of Sn-Sb-Se thin films.

The above-mentioned information-recording media of prior art are not optimized in the composition of the recording layer and in the structure of the film. Therefore, when used as information-recording media of WORM type (namely, the type of write once, read many times) or rewritable type, they all suffer from the problems that they must be initialized before recording, they absorb less semiconductor laser beams and are inferior in recording sensitivity, they are not sufficient in intensity of read-out signal, they are great in distortion of read-out wave form and they are inferior in stability of amorphous state.

SUMMARY OF THE INVENTION

The object of the present invention is to provide an information-recording medium which is superior in recording and reading-out characteristics and high in sensitivity and stability.

In order to attain the above object, the information-recording medium of the present invention comprises a substrate, a recording layer provided on the substrate and changing in atomic arrangement upon irradiation with a recording energy beam, and a reflective layer which is provided on the side of the recording layer reverse to the side irradiated with the recording energy beam and which reflects and absorbs the recording energy beam, said recording layer and said reflective layer being contiguous to each other and the material of the recording layer having an average composition represented by the following formula:

$A_wD_xSb_ySe_z$ (wherein w, x, y and z are in the ranges of $0 \leq w \leq 30$, $3 \leq x \leq 57$, $3 \leq y \leq 57$ and $40 \leq z \leq 90$ in atomic percent, D represents at least one element of Sn, In, Ge, Pb, Si, Bi, Ga, Au, Ag and Cu and A denotes an element other than Sb, Se, the elements represented by D).

Furthermore, the information-recording medium of the present invention comprises a substrate, a recording layer provided on the substrate and changing in atomic arrangement upon irradiation with a recording energy beam, and a reflective layer which is provided on the side of the recording layer reverse to the side irradiated with the recording energy beam and which reflects and absorbs the recording energy beam, said recording layer and said reflective layer being contiguous to each other, and besides, the medium being constructed so that upon irradiation with the recording energy beam there occurs at least one of atomic transfers from the recording layer to the reflective layer and from the reflective layer to the recording layer, the recording layer comprising a material containing at least Sb and Se and the reflective layer comprising a material having a thermal conductivity lower than a given value. It is preferred that the average composition of the recording layer in this information-recording medium also has the following formula:

$A_wD_xSb_ySe_z$ (wherein w, x, y and z are in the ranges of $0 \leq w \leq 30$, $3 \leq x \leq 57$, $3 \leq y \leq 57$ and $40 \leq z \leq 90$ in atomic percent, D represents at least one element of Sn, In, Ge, Pb, Si, Bi, Ga, Au, Ag and Cu and A denotes an element other than Sb, Se, the elements represented by D).

The average composition of the recording layer or the reflective layer here means the average composition in the direction of the film thickness. The A in the formula which represents the average composition of the recording layer is, for example, at least one element of Te, S, O, As, P, N, C, Tl, Al, B, transition metals, alkali metal elements, alkaline earth metal elements, halogen elements and the like.

When the element represented by A in the formula in all of the information-recording media of the present invention comprises at least other elements than Te, Tl and rare earth elements, the total amount of the other elements is preferably 20 atomic % or less. When the element represented by A comprises at least Tl, the amount of Tl is preferably 15 atomic % or less.

As the reflective layer formed in contiguity to the recording layer in the information-recording layer, there may be used metals, semi-metals and semiconductors as far as they as a single substance have a sufficient reflectance of 30% to 80% to regeneration light. However, when a reflective layer which satisfies at least one of the conditions of 20% to 70% in light absorbance and 0.3 W/(cm.deg) or less in thermal conductivity at 273K is used, the recording sensitivity increases. Furthermore, when a thin film which satisfies both the above conditions and which has an average composition represented by the formula $E_hSb_iBi_j$ (wherein h, i and j are in the ranges of $0 \leq h \leq 30$, $35 \leq i \leq 95$ and $5 \leq j \leq 65$ in atomic percent and E represents at least one element of metals, semi-metals and semiconductor elements other than Sb and Bi), the recording sensitivity and the oxidation resistance are especially superior.

When the recording layer and the reflective layer are contiguous to each other, namely, no intermediate layer is provided between the recording layer and the reflective layer, the recording density of the information-recording medium of the present invention is superior and the production cost can be reduced.

In the recording layer and the reflective layer in the information-recording medium of the present invention, the composition may be changed in the direction of film thickness as far as the average composition in the direction of the film thickness is within the range of the above-mentioned ranges. However, change of the composition is preferably not discontinuous.

In the information-recording medium of the present invention, both the phase-transition (transition of one phase to another phase) and the atomic diffusion (diffusion of atoms between the layers formed) can occur as the change in atomic arrangement. For example, when an Sb-Bi based alloy having a high Bi content is used as the reflective layer which is contiguous to the recording layer, diffusion of Bi atoms from the reflective layer occurs simultaneously with the phase-transition. When an Sb-Bi based alloy having a high Sb content is used as the reflective layer which is contiguous to the recording layer, the phase-transition mainly occurs. The diffusion of atoms is effective for improving stability of the recorded marks when the information-recording medium is used as WORM type.

Recording and erasure can bring about the change in atomic arrangement and are carried out with an irradiation time and with an energy beam (such as semiconductor laser beam) of power which do not cause great deformation of the recording layer and reading-out is carried out with an irradiation time and with an energy beam of power which do not cause change in the atomic arrangement.

The present invention requires no initial crystallization of the recording layer by irradiation with an Ar laser beam or a semiconductor laser beam or by flash annealing before recording. Without such initialization, high recording sensitivity and good recording and reading-out characteristics can be obtained.

Roles of the elements of the respective groups in the recording layer of the information-recording medium of the present invention are as follows. When an alloy containing Sb and Se is used, crystallization at recording can be carried out at high speed with maintaining the stability of amorphous state. Besides, the oxidation resistance of the recording layer is extremely high. Furthermore, by allowing Se to be present together with the elements represented by D such as Sn, the stability of amorphous state can be further improved and crystallization at recording can be carried out at higher speed.

Sn, Pb, Ge and Si of Group IVb elements among the elements represented by D are preferred for improving the stability of amorphous state and In, Bi and Ga of Groups IIIb and Vb ar preferred for increasing the intensity of read-out signals. Au, Ag and Cu of Group Ib among the elements represented by D are preferred for increasing crystallizing speed at recording.

Sn is especially preferred as a recording layer of WORM type among the elements represented by D. The elements preferred next to Sn among the Group IVb elements are Ge and Pb and the preferred element among the Groups IIIb and Vb elements represented by D is In and the preferred element among the Group Ib elements is Au. On the other hand, among the elements represented by D, the element especially preferred as a reversible type recording layer is In. Sn and Ge are preferred next to In among the Group IVb elements and Bi is the preferred element among the Groups IIIb and Vb elements represented by D and Au is the preferred element among the Group Ib elements.

The intensity of read-out signals can be increased by adding Te and S of the elements represented by A in an amount of 5-30 atomic %. The crystallization temperature can be increased by adding the transition metal elements such as Co, Ni, Ti and Pd of the elements represented by A in an amount of 1-20 atomic %. The crystallizing speed at recording can be increased by adding Tl and the alkali metal elements represented by A in an amount of 1-15 atm %. Since the rare earth elements such as La and Ce of the elements represented by A when added in an amount of 1-30 atm % form high-melting point compounds with Se, they improve rewriting characteristics when used as a reversible type recording layer.

Among the elements represented by A, it is preferred to use at least one of Te, S, Co, Ni, Ti and Pd and especially preferred is Te.

Addition of the rare gas elements such as Ar and Xe does not give especially conspicuous effect, but if the addition amount is small, no seriously adverse influence is brought about. The rare gas elements sometimes incorporate into the recording layer and others depending on the conditions for sputtering or the like in forming the recording layer and others. Therefore, the recording layer and others may contain the rare gas elements.

More preferred ranges of w, x, y and z which show the ratio of the respective constituting elements of the recording layer are as follows.

$$0 \leq w \leq 20, 3 \leq x \leq 45, 3 \leq y \leq 45, 50 \leq z \leq 90$$

Especially preferred ranges of w, x, y and z are as follows.

$$0 \leq w \leq 10, 5 \leq x \leq 35, 5 \leq y \leq 40, 55 \leq z \leq 90$$

Furthermore, w=0 is preferred for any ranges of x, y and z because the number of the constituting elements in the recording layer can be reduced and thus the cost can be reduced.

Changes in the contents of the respective elements in the recording layer in the direction of the film thickness are usually small, but there may be present the changes of optional patterns. Especially, for Sb and Se, the contents at either one of the interfaces of the recording layer (including the interface with other layer) are preferably higher than those of inside of the layer.

As the reflective layer formed contiguous to the recording layer in the information-recording medium of the present invention, there may be used such one as having a light absorbance of 20% or higher in the state being laminated with the recording layer, whereby utilization efficiency of laser beams for heat can be enhanced. Moreover, when a reflective layer mainly composed of low thermal conductivity materials having a thermal conductivity of 0.3 W/(cm.deg) or lower at 273K is used, superfluous heat conduction to the layers other than the recording layer can be inhibited. Both the cases have the effect to make it possible to surely attain the recording even by irradiation with a low power laser beam. As materials of the reflective layer, preferred are alloys containing at least one of Sb alloy, Bi alloy, Sb-Bi alloy, Ti, Zr, Hf, Ti alloy, Zr alloy, Hf alloy, stainless steel, Nichrome, Manganin, Constantan, Inconel and Monel.

Among the materials used for the reflective layer, alloys containing Sb and Bi as main components are preferred in view of superior recording sensitivity of the medium and high intensity of read-out signals.

The reflective layer, as heretofore noted, has a composition represented by the formula $E_h Sb_i Bi_j$ wherein h, i and j are in the range of $0 \leq h \leq 30$, $35 \leq i \leq 95$ and $5 \leq j \leq 65$ in atomic percent and E represents at least one element of metals, semi-metals and semiconductor elements other than Sb and Bi.

More preferred ranges of h, i and j which show the ratio of the respective constituting elements in the Sb-Bi alloy reflective layer are as follows.

$$h=0, 50 \leq i \leq 90, 10 \leq j \leq 50 \text{ or}$$

$$1 \leq h \leq 20, 50 \leq i \leq 94, 5 \leq j \leq 49$$

Especially preferred ranges of h, i and j are as follows.

$$h=0, 60 \leq i \leq 90, 10 \leq j \leq 40 \text{ or}$$

$$1 \leq h \leq 10, 60 \leq i \leq 94, 5 \leq j \leq 39$$

Among the elements represented by E, preferred are Sn, Ge, Si, Pb, Te, Se and transition metal elements and Co, Ti, Ni and Pd are preferred in the transition metal elements. Addition of these elements in a small amount has the effect to reduce the crystal grain size of the Sb-Bi alloy reflective layer and to diminish the disc noise. However, some of them in a large addition amount rather increase the crystal grain size. $h=0$ is preferred for any ranges of i and j because the number of the constituting elements in the recording layer can be reduced and thus the cost can be reduced.

On the other hand, as the materials used in the reflective layer, alloys containing at least one of Ti, Zr, Hf, Ti alloy, Zr alloy, Hf alloy, stainless steel, Nichrome, Manganin, Constantan, Inconel and Monel are preferred to the alloys containing Sb or Bi in that the toxicity of the former is lower.

When the recording layer and the reflective layer contiguous to the recording layer are put together to form an information-recording carrier layer, if at least one side of this information-recording carrier layer of the present invention is protected by bonding thereto a protective layer comprising other materials than those of the recording layer and the reflective layer, environmental resistance of the information-recording medium is improved. It is a matter of course that if both sides of the information-recording carrier layer are protected, the environmental resistance of the information-recording medium is further improved and rewriting performance of the medium when used as reversible type is improved.

These protective layers may be formed of organic materials such as, for example, acrylic resins, polycarbonates, polyolefins, epoxy resins, polyimides, polyamides, polystyrenes, polyethylenes, polyethylene terephthalates, fluoro-resins (polyethylene tetrafluoride, etc.) and ultraviolet-curing resins. These protective layer may serve as substrates.

The protective layers may also be formed of inorganic materials mainly composed of oxides, fluorides, nitrides, sulfides, carbides, borides, boron, carbon, metals and the like. Composite materials of them may also be used. Examples of the materials of the inorganic protective layer are oxides of at least one element selected from the group consisting of Ce, La, Si, In, Al, Ge, Pb, Sn, Bi, Te, Ta, Sc, Y, Ti, Zr, V, Nb, Cr and W, sulfides of at least one element selected from the group consisting of Cd, Zn, Ga, In, Sb, Ge, Sn, Pb and Bi, fluorides of Mg, Ce, Ca or the like, nitrides of Si, Al, Ta, B or the like, carbides of B, Si or the like, borides of Ti or the like, boron and carbon. Specific examples are those which contain the main component having the composition close to one of $CeO_2$, $La_2O_3$, $SiO$, $SiO_2$, $In_2O_3$, $Al_2O_3$, $GeO$, $GeO_2$, $PbO$, $SnO$, $SnO_2$, $Bi_2O_3$, $TeO_2$, $Ta_2O_5$, $Sc_2O_3$, $Y_2O_3$, $TiO_2$, $ZrO_2$, $V_2O_5$, $Nb_2O_5$, $Cr_2O_3$, $WO_2$, $WO_3$, $CdS$, $ZnS$, $In_2S_3$, $Sb_2S_3$, $Ga_2S_3$, $GeS$, $SnS$, $SnS_2$, $PbS$, $Bi_2S_3$, $MgF_2$, $CeF_3$, $CaF_2$, $TaN$, $Si_3N_4$, $AlN$, $BN$, $Si$, $TiB_2$, $B_4C$, $SiC$, $B$ and $C$. Mixtures of these materials may also be used. A substrate mainly composed of glass, quartz, sapphire, iron, titanium or aluminum can also serve as one of the inorganic protective layers.

Of sulfides as the materials for the inorganic protective layer, those which have a composition close to ZnS are preferred in that they have proper index of refraction and the layer is stable. As the nitrides, those which have a composition close to TaN, $Si_3N_4$ or AlN (aluminum nitride) is preferred in that the surface reflectance is not so high and the layer is stable and strong. Of the oxides, preferred are those which have a composition close to $Y_2O_3$, $Sc_2O_3$, $CeO_2$, $TiO_2$, $ZrO_2$, $SiO$, $Ta_2O_5$, $In_2O_3$, $Al_2O_3$, $SnO_2$ or $SiO_2$. Amorphous compounds of Si containing hydrogen are also preferred.

Of the organic material layer and the inorganic material layer, it is preferred from the point of heat resistance that the carrier layer adheres to the inorganic material layer. However, when the inorganic material layer (excluding the layer which serves as a substrate) is thick, there may occur at least one of cracking, reduction in transmittance and reduction in sensitivity. Therefore, it is preferred that the inorganic material layer is thin and a thick organic material layer is allowed to adhere to the side of the carrier layer which is reverse to the inorganic material layer side for enhancing mechanical strength. This organic material layer may be a substrate. Such arrangement of the layers can also inhibit distortion. The materials used for the organic material layer include, for example, polystyrenes, polyethylene tetrafluoride, polyimides, acrylic resins, polyolefins, polyethylene terephthalate, polycarbonates, epoxy resins, hot-melt adhesives such as ethylene-vinyl acetate copolymer, self-adhesives and ultraviolet-curing resins.

The protective layer comprising an inorganic material may be formed by electron beam vapor deposition or sputtering of the material as it is, but the layer can be formed more easily by employing reactive sputtering or by forming a layer comprising at least one element of metals, semi-metals and semi-conductors and then carrying out the reaction with at least one of oxygen, sulfur and nitrogen.

A multi-layered protective layer can further enhance the protecting effect. For example, when a thin film of 30–300 nm thick having a composition close to $SiO_2$ and a thin film of 30–300 nm thick having a composition close to ZnS are provided in such a manner that the latter is positioned nearer to the information-recording carrier layer than the former, environmental resistance and record/erase characteristics are markedly improved and rewriting performance can also be greatly improved. When the protective layer is provided on the substrate side (the side of incidence of light), this protective layer can also serve as a reflection inhibiting layer for increasing the intensity of read-out signals.

The recording layer of the present invention may be in the form of a dispersion in the oxides, fluorides, nitrides, organic materials, carbon or carbides which ar mentioned above to be usable for the protective layer, said dispersion being formed by co-vapor deposition, co-sputtering or the like. In this case, sometimes, coefficient of light absorption can be adjusted and the intensity of regenerated signals can be increased. The mixing degree is preferably 40% or less in terms of the proportion occupied by oxygen, fluorine, nitrogen and carbon in the whole layer. By making such a composite film, usually the crystallizing speed decreases and the sensitivity decreases. However, in the case of a composite film with organic materials, the sensitivity is improved.

With reference to the thickness of the respective layers, the following ranges are preferred since good recording and reading-out can be attained in these ranges.

| | |
|---|---|
| Thickness of the recording layer: | 5–500 nm |
| Thickness of the reflective layer: | 10–500 nm |
| Thickness of the inorganic protective layer: | 5–500 nm |
| Thickness of the organic protective layer: | 500 nm–10 mm |

The following ranges are more preferred since further superior recording and regeneration can be attained.

| | |
|---|---|
| Thickness of the recording layer: | 10–300 nm |
| Thickness of the reflective layer: | 20–200 nm |
| Thickness of the inorganic protective layer: | 10–300 nm |
| Thickness of the organic protective layer: | 2 μm–1 mm |

With reference to the thickness of the recording layer, 15–170 nm is especially preferred because change in reflectance caused by recording is great owing to the effect of interference of light. The range of 15–80 nm is further preferred since the recording sensitivity is also high.

The above-mentioned materials and thickness of the layers other than the recording layer are also effective not only for the recording layer, but also for other phase-transition recording layer, interdiffusion type recording layer and magneto optical recording layer. Especially the reflective layer of the present invention is very effective when light absorbance of the recording layer is low, for example, when the thickness of the recording layer is thin or extinction coefficient of the recording layer is small. Thus, the magneto optical recording layer is suitable when the thickness thereof is thin, less than 30 nm, for rare earth-transition metal system of large extinction coefficient. Moreover, it is especially suitable for garnet system of small extinction coefficient.

The respective layers can be formed by a method optionally selected from vacuum deposition, gas phase deposition, sputtering, ion beam deposition, ion plating, electron beam deposition, injection molding, casting, spin coating and plasma polymerization. When all of the recording layer, the reflective layer and the inorganic protective layer are formed by sputtering, compositions and thickness can be easily controlled and the production cost can be reduced. Thus, this is preferred.

The recording layer of the present invention can be changed in its optical properties by some change in atomic arrangement which causes substantially no change in its shape. It may be the change in crystal grain size or crystal form or the change between crystal state and metastable state as well as the change between amorphous state and crystal state. In the change between the amorphous state and the crystal state, the amorphous state may not be complete amorphous state, but it may partially contain crystal parts. Furthermore, recording may be effected by transfer (by diffusion, chemical reaction, etc.) between the recording layer and the reflective layer of a part of atoms which constitute these layers or by both the transfer and the phase-transition.

The information-recording medium of the present invention can be used not only in the form of a disk, but also in the form of a tape, a card or the like.

DETAILED DESCRIPTION OF THE PREFERRED EMBODIMENT

Figure 1:
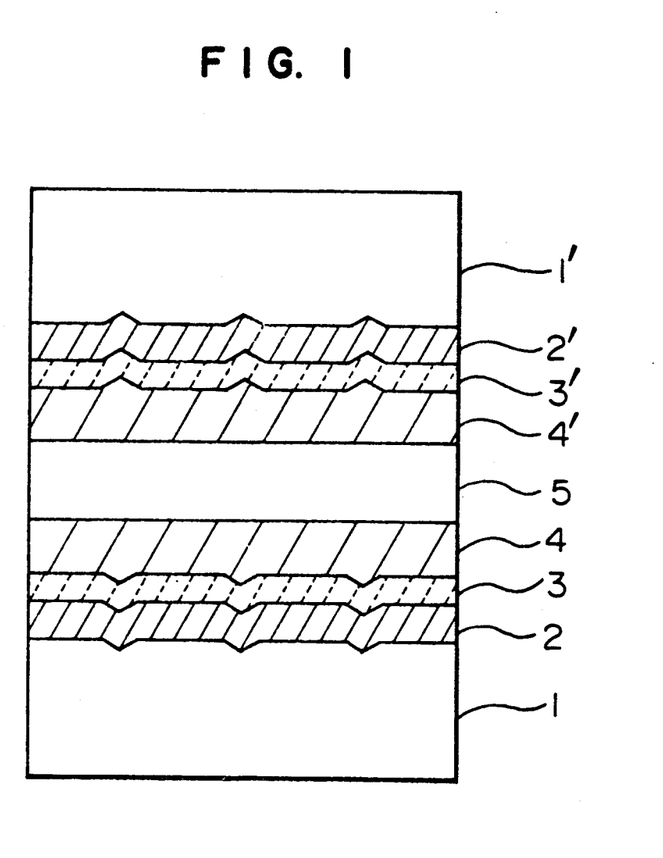
FIG. 1 is a cross-sectional view of the information-recording medium of an example of the present invention.

The present invention will be explained in detail by the following examples. A replica of grooves for tracking which also serve as a protective layer was formed of an ultraviolet-curing resin on a disk-like chemically reinforced glass sheet of 300 mm in diameter and 1.2 mm in thickness and a substrate was prepared in which one circumference was divided into 51 sectors and track address or sector address is provided in the form of rugged pits in the land portion between the grooves at the beginning of the respective sectors (this portion is called a header portion). As shown in FIG. 1, on this substrate 1 was first formed recording layer 2 having the composition of $Sn_{17}Sb_{17}Se_{66}$ in atomic % at a thickness of 25 nm by high-frequency sputtering and successively was formed reflective layer 3 having the composition of $Sb_{80}Bi_{20}$ in atomic % and having a thermal conductivity Of 0.3 W/(cm.deg) or less at 273K at a thickness of about 40 nm in the same sputtering apparatus as used for formation of the recording layer. Furthermore, an ultraviolet-curing resin was spin coated on the reflective layer 3 and cured to form organic material layer 4 of 50 μm thick. In the same manner, on another similar substrate 1' were formed in succession recording layer 2' having the composition of $Sn_{17}Sb_{17}Se_{66}$, reflective layer 3' having the composition of $Sb_{80}Bi_{20}$ and organic material layer 4'. The thus prepared two disks were stuck together so that the organic material layers 4 and 4' adhered to each other with adhesive layer 5 provided therebetween to make disk A. Then, disk B was made in the same construction as the disk A except that the composition of the recording layer 2 was $In_{17}Sb_{17}Se_{66}$.

Evaluation of the resulting disks A and B on recording and reading-out was conducted using an optical disk drive (recording.regenerating apparatus). First, recording was conducted in the following manner. The disk was rotated at 1000 rpm and a continuous light from a semiconductor laser (wavelength: 690 nm and maximum output on the medium: 15 mW) which was kept at such a low power level as cannot perform recording and which was focused by an objective lens having a numerical aperture of 0.55 in the recording head was irradiated to the recording film 2 at the position of 140 mm in radius through the substrate 1 and a reflected light was detected whereby the head was driven so that the center of the light spot always meets the middle between the tracking grooves. The influence of noise generated from the grooves can be avoided by employing the middle between the grooves as the recording track. With carrying out the tracking in this way, further automatic focusing was conducted so that the focal point came onto the recording film, thereby to perform recording and reading-out. When recording is carried out on this recording track by crystallization, the range of laser power suitable for crystallization is such that is high enough to allow crystallization to occur and is lower than the level for conversion to amorphous state. When erasure is carried out by transition to amorphous state, the range of laser power suitable for transition to amorphous state is such that is higher than the power at which crystallization occurs and is lower than the power at which strong distortion occurs or holes are made.

Figure 2:
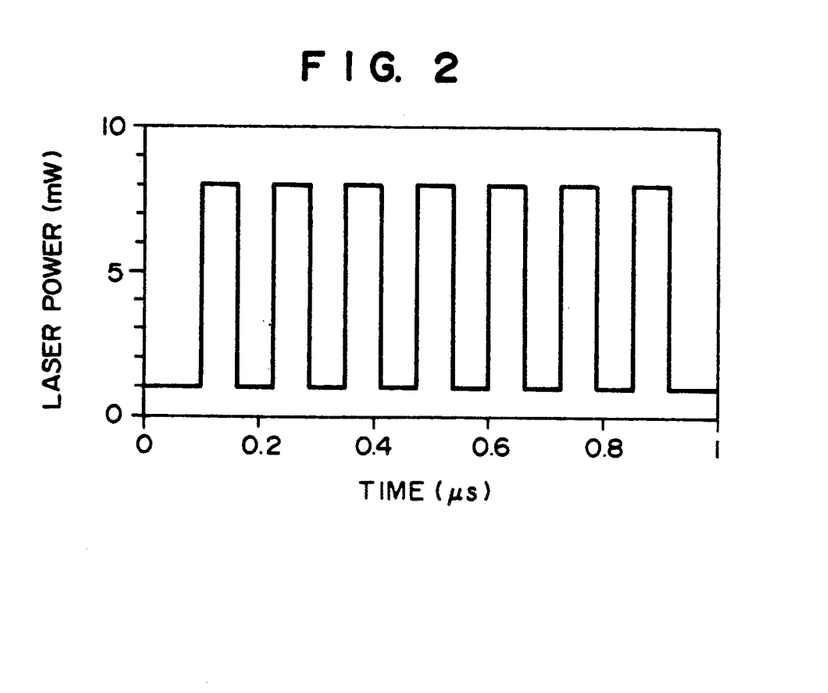
FIG. 2 is a graph which shows the recording laser wave form for WORM type medium of an example of the present invention.

The disk A was used as WORM type and recording was effected by changing the laser power as shown in FIG. 2 between 1.0 mW of the level of reading beam and 8.0 mW of power level for recording by crystallization.

Figure 3:
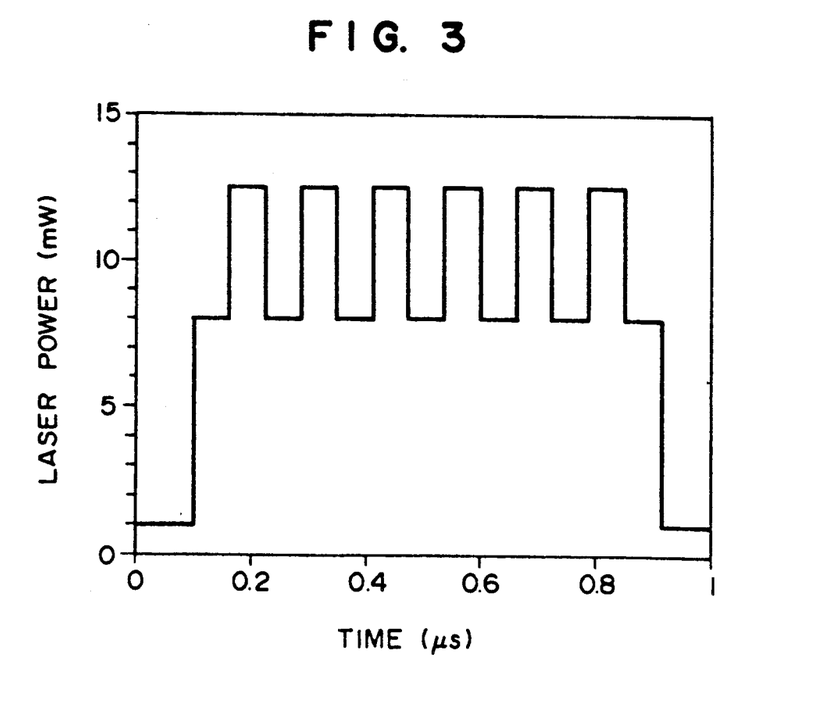
FIG. 3 is a graph which shows the recording laser wave form for reversible, overwriting type medium of an example of the present invention.

Furthermore, the disk B was used as reversible type and recording was effected by changing the laser power as shown in FIG. 3 between 8.0 mW of intermediate power level for crystallization and 12.5 mW of high power level for transition to amorphous state. The power ratio between the high power level for transition to amorphous state and the intermediate power level for crystallization is especially preferably 1:0.4–1:0.8. When the head passed the recording part, the laser power was lowered to 1.0 mW of the level for reading beam. And then tracking and automatic focusing were continued. Tracking and automatic focusing are also continued during recording.

According to the recording in reversible type disk, when recording is carried out in the part where recording has already been carried out, the recorded information is replaced with the freshly recorded information. That is, overwriting by a single circular light spot is possible. However, at the first rotation or at a plurality of rotations in rewriting of the record, when a continuous light of a power close to 12.5 mW which is the higher power of the above laser powers modulated, for example, of 11.5 mW is irradiated to once carry out erasure and then, at the next one rotation, a laser beam which was power modulated in accordance with the information signal between 8.0 mW and 12.5 mW was irradiated to effect recording, the information which was previously written and remained unerased was a little and a high carrier to noise ratio (hereinafter referred to as "CNR") was obtained. In this case, good rewriting could be performed when the power of the continuous light first irradiated was in the range of 0.8–1.1 assuming the above-mentioned higher power level to be 1.

Next, reading-out was effected in the following manner. The disk was rotated at 1000 rpm and with carrying out the tracking and the automatic focusing on the previously recorded track, a continuous light of the low power of 1.0 mW by which recording and erasion cannot be performed was irradiated onto the surface of the disk and intensity of the reflected light was detected to read-out the information.

First, recording was effected in the disk A used as WORM type with a signal of 8 MHz and 50% in duty at a recording power of 8.0 mW without initial crystallization and this recorded mark was read-out to obtain a read-out signal output of 36% in read-out signal modulation and 57 dB in CNR. The read-out signal modulation was defined by the following formula.

$M = |R_0 - R|/R_0$ (wherein M denotes regenerated signal modulation degree, $R_0$ denotes regenerated signal output level before recording and R denotes regenerated signal output level after recording). The CNR was measured by resolution band width of 30 kHz.

The recording layer 2 having the composition of $Sn_{17}Sb_{17}Se_{66}$ in the disk A was markedly excellent in oxidation resistance and when a test piece prepared by forming the recording layer 2 alone on a glass was left to stand for 3000 hours under the conditions of 60° C. and 95%RH, no change occurred in the reflectance of the medium to the reading beam and the recording layer was hardly oxidized. Moreover, when the disk A subjected to recording as above was left to stand for 3000 hours under the conditions of 60° C. and 95%RH, the read-out signal output did not change, namely, the read-out signal modulation was 36% and the CNR was 57 dB.

When Se content in the Sn-Sb-Se recording layer 2 was changed with keeping the relative ratio of other elements at nearly constant, the recording power and the CNR in the case of recording a signal of 8 MHz and 50% in duty changed as shown in the following Table 1.

TABLE 1

| Composition (atomic %) | | | Recording power | CNR |
|---|---|---|---|---|
| $Sn_{32.5}$ | $Sb_{32.5}$ | $Se_{35}$ | 5.5 mW | 42.0 |
| $Sn_{30}$ | $Sb_{30}$ | $Se_{40}$ | 6.0 | 46.0 |
| $Sn_{25}$ | $Sb_{25}$ | $Se_{50}$ | 6.5 | 49.0 |
| $Sn_{22.5}$ | $Sb_{22.5}$ | $Se_{55}$ | 7.0 | 52.0 |
| $Sn_{20}$ | $Sb_{20}$ | $Se_{60}$ | 7.5 | 55.0 |
| $Sn_{17}$ | $Sb_{17}$ | $Se_{66}$ | 8.0 | 57.0 |
| $Sn_{15}$ | $Sb_{15}$ | $Se_{70}$ | 8.5 | 58.0 |
| $Sn_{10}$ | $Sb_{10}$ | $Se_{80}$ | 11.0 | 57.0 |
| $Sn_5$ | $Sb_5$ | $Se_{90}$ | 13.5 | 56.0 |
| $Sn_{2.5}$ | $Sb_{2.5}$ | $Se_{95}$ | Recording was impossible with 15.0 mW | |

Here, the CNR necessary for reading-out of digital signal is at least 45 dB.

When Sb content was changed with keeping the relative ratio of other elements at nearly constant, the CNR and the crystallization temperature in the case of recording a signal of 8 MHz and 50% in duty changed as shown in the following Table 2.

TABLE 2

| Composition (atomic %) | | | CNR | Crystallization temperature |
|---|---|---|---|---|
| $Sn_{20}$ | $Sb_1$ | $Se_{79}$ | 56.0 dB | 120° C. |
| $Sn_{20}$ | $Sb_3$ | $Se_{77}$ | 57.0 | 180 |
| $Sn_{19.5}$ | $Sb_5$ | $Se_{75.5}$ | 57.5 | 200 |
| $Sn_{18.5}$ | $Sb_{10}$ | $Se_{71.5}$ | 58.0 | 230 |
| $Sn_{17.5}$ | $Sb_{15}$ | $Se_{67.5}$ | 57.5 | 250 |
| $Sn_{17}$ | $Sb_{17}$ | $Se_{66}$ | 57.0 | 260 |

TABLE 2-continued

| Composition (atomic %) | | | CNR | Crystallization temperature |
|---|---|---|---|---|
| $Sn_{16.5}$ | $Sb_{20}$ | $Se_{63.5}$ | 56.5 | 250 |
| $Sn_{14.5}$ | $Sb_{30}$ | $Se_{55.5}$ | 55.5 | 200 |
| $Sn_{12.5}$ | $Sb_{40}$ | $Se_{47.5}$ | 54.0 | 210 |
| $Sn_{11.5}$ | $Sb_{45}$ | $Se_{43.5}$ | 51.0 | 215 |
| $Sn_{10}$ | $Sb_{50}$ | $Se_{40}$ | 48.0 | 220 |
| $Sn_9$ | $Sb_{57}$ | $Se_{34}$ | 46.0 | 225 |
| $Sn_8$ | $Sb_{60}$ | $Se_{32}$ | 39.0 | 230 |

Here, the temperature for crystallization from amorphous state necessary for maintaining the recorded mark for more than 100 years at 60° C. was 150° C. or higher.

When Sn content was changed with keeping the relative ratio of other elements at nearly constant, the CNR and the crystallization temperature in the case of recording a signal of 8 MHz and 50% in duty changed as shown in the following Table 3.

TABLE 3

| Composition (atomic %) | | | CNR | Crystallization temperature |
|---|---|---|---|---|
| $Sn_1$ | $Sb_{20}$ | $Se_{79}$ | 56.0 dB | 100° C. |
| $Sn_3$ | $Sb_{20}$ | $Se_{77}$ | 57.5 | 170 |
| $Sn_5$ | $Sb_{19.5}$ | $Se_{75.5}$ | 58.0 | 200 |
| $Sn_{10}$ | $Sb_{18.5}$ | $Se_{71.5}$ | 58.0 | 230 |
| $Sn_{15}$ | $Sb_{17.5}$ | $Se_{67.5}$ | 57.5 | 250 |
| $Sn_{17}$ | $Sb_{17}$ | $Se_{66}$ | 57.0 | 260 |
| $Sn_{20}$ | $Sb_{16.5}$ | $Se_{63.5}$ | 56.5 | 275 |
| $Sn_{30}$ | $Sb_{14.5}$ | $Se_{55.5}$ | 55.5 | 340 |
| $Sn_{35}$ | $Sb_{13.5}$ | $Se_{51.5}$ | 55.0 | 370 |
| $Sn_{40}$ | $Sb_{12.5}$ | $Se_{47.5}$ | 52.0 | 390 |
| $Sn_{45}$ | $Sb_{11.5}$ | $Se_{43.5}$ | 50.0 | 395 |
| $Sn_{50}$ | $Sb_{10}$ | $Se_{40}$ | 48.0 | 400 |
| $Sn_{57}$ | $Sb_9$ | $Se_{34}$ | 46.0 | 410 |
| $Sn_{60}$ | $Sb_8$ | $Se_{32}$ | 38.0 | 415 |

When the composition was changed on a straight line which links $Sb_2Se_3$ with SnSe in the ternary phase diagram of Sn-Sb-Se, the CNR and the crystallization temperature in the case of recording a signal of 8 MHz and 50% in duty changed as shown in the following Table 4.

TABLE 4

| Composition (atomic %) | | | CNR | Crystallization temperature |
|---|---|---|---|---|
| $Sn_3$ | $Sb_{36.4}$ | $Se_{60.6}$ | 56.5 dB | 190° C. |
| $Sn_5$ | $Sb_{34}$ | $Se_{61}$ | 57.0 | 210 |
| $Sn_{10}$ | $Sb_{28}$ | $Se_{62}$ | 57.5 | 230 |
| $Sn_{18.2}$ | $Sb_{18.2}$ | $Se_{63.6}$ | 57.0 | 250 |
| $Sn_{25}$ | $Sb_{10}$ | $Se_{65}$ | 56.0 | 270 |
| $Sn_{29.2}$ | $Sb_5$ | $Se_{65.8}$ | 55.0 | 260 |
| $Sn_{30.8}$ | $Sb_3$ | $Se_{66.2}$ | 52.0 | 240 |
| $Sn_{32.5}$ | $Sb_1$ | $Se_{66.5}$ | 42.0 | 220 |

When in the Sn-Sb-Se recording layer 2 of the disk A a part or the whole of Sn was replaced with at least one element of In, Ge, Pb, Si, Bi, Ga, Au, Ag and Cu, very similar characteristics were obtained in the case of carrying out recording and reading-out using the disk A as WORM type. Among the above elements represented by D in the formula, Sn is the best in the recording and reading-out characteristics as WORM type. Next, Ge and Pb are preferred among the Group IVb elements. Preferred element of the Groups IIIb and Vb elements is In and preferred element of the Group Ib elements is Au. When Te was added to the Sn-Sb-Se recording layer 2 of the disc A and the Te content (w) was changed with keeping the relative ratio of the constituting elements at constant, the recording power and the CNR in the case of recording a signal of 8 MHz and 50% in duty changed as shown in the following Table 5.

TABLE 5

| Composition (atomic %) | Recording power | CNR |
|---|---|---|
| w = 0 | 8.0 mW | 57.0 dB |
| w = 5 | 7.0 | 55.0 |
| w = 10 | 6.5 | 52.0 |
| w = 20 | 6.0 | 49.0 |
| w = 30 | 5.5 | 47.0 |

When Te content was higher than the above contents, recording was impossible unless the initial crystallization was effected. Here, addition of S in place of a part or the whole of Te has the effect to increase intensity of the regenerated signal.

When Co was added to the Sn-Sb-Se recording layer 2 of the disc A and the Co content (w) was changed with keeping the relative ratio of the constituting elements at constant, the CNR and the crystallization temperature in the case of recording a signal of 8 MHz and 50% in duty changed as shown in the following Table 6.

TABLE 6

| Composition (atomic %) | CNR | Crystallization temperature |
|---|---|---|
| w = 0 | 57.0 dB | 260° C. |
| w = 1 | 56.0 | 280 |
| w = 5 | 55.0 | 320 |
| w = 7 | 53.0 | 340 |
| w = 10 | 50.0 | 360 |
| w = 20 | 46.0 | 410 |

When the Co content is higher than the above, intensity of the read-out signal is low. Here, when a part or the whole of Co was replaced with at least one element of the transition metal elements (Groups IIIa, IVa, Va, VIa, VIIa and VIII), also the similar characteristics were obtained. Among them, at least one of Co, Ni, Ti and Pd has the great effect to raise the crystallization temperature. Moreover, addition of a rare earth element such as Gd in an amount of 10 atm % or less in place of Co with keeping the relative ratio of the constituting elements in the Sn-Sb-Se recording layer 2 at constant has the effect to raise the crystallization temperature. The addition amount is preferably 7 atomic % or less, especially preferably 5 atomic % or less as the range for attaining superior recording and reading-out characteristics. Further, addition of at least one of Tl, halogen elements and alkali metal elements in an amount of 10 atm % or less in place of Co with keeping the relative ratio of the constituting elements in the Sn-Sb-Se recording layer 2 at constant has the effect to reduce the recording power. Of these elements, Tl is especially preferred and then, I is preferred as the halogen elements and Na and K are preferred as the alkali metal elements. The addition amount is preferably 1-5 atm % for obtaining good oxidation resistance.

On the other hand, when Bi content was changed in the Sb-Bi reflective layer 3 of the disk A, the CNR changed as shown in the following Table 7 just after a signal of 8 MHz and 50% in duty was recorded by a recording power of 10 mW and after the disk was left to stand for 3000 hours under the conditions of 60° C. and 95%RH.

TABLE 7

| Composition (atomic %) | | CNR Just after recording | CNR After left to stand at 60° C., 95% RH for 3000 hours |
|---|---|---|---|
| $Sb_{30}$ | $Bi_{70}$ | 56 dB | 42 dB |
| $Sb_{35}$ | $Bi_{65}$ | 57 | 49 |
| $Sb_{40}$ | $Bi_{60}$ | 57 | 53 |
| $Sb_{50}$ | $Bi_{50}$ | 57 | 55 |
| $Sb_{60}$ | $Bi_{40}$ | 57 | 57 |
| $Sb_{70}$ | $Bi_{30}$ | 57 | 57 |
| $Sb_{80}$ | $Bi_{20}$ | 57 | 57 |
| $Sb_{90}$ | $Bi_{10}$ | 56 | 56 |
| $Sb_{95}$ | $Bi_{5}$ | 51 | 51 |
| $Sb_{100}$ | | 40 | 40 |

Furthermore, when the composition of the Sb-Bi reflective layer 3 of the disk A was $Sb_{80}Bi_{20}$ and Sn was added with keeping the relative ratio of Sb and Bi at constant, the disk noise (RIN; relative intensity noise) in unrecorded part with 8 MHz changed as shown in the following Table 8 where the proportion of Sn was shown by h.

TABLE 8

| Composition (atomic %) | RIN |
|---|---|
| h = 0 | −77 dB |
| h = 1 | −79 |
| h = 2 | −81 |
| h = 5 | −82 |
| h = 7 | −81 |
| h = 10 | −79 |
| h = 15 | −78 |
| h = 20 | −77.5 |
| h = 25 | −77 |
| h = 30 | −76.5 |
| h = 35 | −71 |

In the case of the composition of the reflective layer 3 where RIN is small, namely, less than −76 dB, the crystal grain size is small, namely, smaller than 1000 nm and is preferable.

When Ge, Si, Pb or Te was used in place of Sn in the above reflective layer 3, the similar characteristics were obtained. Of the above additive elements, Sn is preferred in view of the high read-out signal intensity and Te is preferred in that the thermal conductivity of the reflective layer further lowers and the recording sensitivity is satisfactory. Ge is preferred next to Sn and Te.

Furthermore, when the composition of the Sb-Bi reflective layer 3 of the disk A was $Sb_{80}Bi_{20}$ and Co was added with keeping the relative ratio of Sb and Bi at constant, the disk noise (RIN; relative intensity noise) in unrecorded part at 8 MHz changed as shown in the following Table 9 where the proportion of Co was shown by h.

TABLE 9

| Composition (atomic %) | RIN |
|---|---|
| h = 0 | −77 dB |
| h = 1 | −78 |
| h = 2 | −79 |
| h = 5 | −81 |
| h = 7 | −79 |
| h = 10 | −78 |
| h = 15 | −77.5 |
| h = 20 | −77 |
| h = 25 | −76.5 |
| h = 30 | −76 |

TABLE 9-continued

| Composition (atomic %) | RIN |
|---|---|
| h = 35 | −70 |

In the case of the composition of the reflective layer 3 where RIN was small, namely, less than −76 dB, the crystal grain size was small, namely, smaller than 100 nm.

When other transition metal was used in place of Co in the above reflective layer 3, the similar characteristics were obtained. Of the above transition metals, Ti, Ni and Pd are preferred in addition to Co in view of the low disk noise. Furthermore, oxidation resistance of the reflective layer was improved by adding 10 atomic % or less of Se with keeping the relative ratio of the constituting elements in the Sb-Bi reflective layer 3 at constant.

When stainless steel (SUS 316), Nichrome ($Ni_{80}Cr_{20}$), Ti, and $Ti_{70}Al_{30}$ (Ti alloy) which had the same low thermal conductivity of 0.3 W/(cm.deg) or less as the Sb-Bi layer were used in place of the Sb-Bi system as the reflective layer 3 of the disk A, the recording power and the CNR in the case of recording a signal of 8 MHz and 50% in duty changed as shown in the following Table 10.

TABLE 10

| Material of reflective layer | Recording power | CNR |
|---|---|---|
| Stainless steel | 9.0 mW | 51.5 dB |
| Nickrome | 9.0 | 51.0 |
| $Ti_{70}Al_{30}$ | 9.5 | 49.5 |
| Ti | 9.5 | 49.0 |

When an alloy containing at least one of Zr, Hf, Zr alloy, Hf alloy, Manganin, Constantan, Inconel and Monel which had a thermal conductivity of 0.3 W/(cm.deg) or less was used in place of the material of the above reflective layer 3, the similar characteristics, namely, a recording power of about 10 mW and a CNR of about 50 dB were obtained. These reflective layers are smaller in the CNR by more than 5 dB as compared with the Sb-Bi reflective layer. This is because when the reflective layer is laminated with the recording layer of the present invention, the intensity of the read-out signal of the information recording signal does not so increase as in the Sb-Bi layer due to difference in optical constant of the reflective layers per se.

When an intermediate layer was formed between the recording layer 2 and the reflective layer 3 of the disc A as a comparative example, the cost for film formation in making the medium increased to 1.5 time. In addition, when ZnS was used as the intermediate layer and thickness of this ZnS intermediate layer was changed, the recording power and the CNR in the case of recording a signal of 8 MHz and 50% in duty changed as shown in the following Table 11.

TABLE 11

| Thickness of ZnS intermediate layer | Recording power | CNR |
|---|---|---|
| 0 nm | 8.0 mW | 57.0 dB |
| 30 | 12.0 | 53.0 |
| 60 | 15.0 | 49.0 |
| 100 | Recording was impossible with 15.0 mW. | |

Next, a signal of 8 MHz and 50% in duty and a signal of 5 MHz and 50% in duty were alternately recorded by overwriting in disk B as reversible type which was prepared by replacing the whole of Sn in the Sn-Sb-Se recording layer 2 of the disk A with In, namely, which had $In_{17}Sb_{17}Se_{66}$ recording layer 2. Here, when a signal of 5 MHz was recorded with a medium power of 8.0 mW and a high power of 13.0 mW without initialization, a read-out signal output of 37% in contrast ratio and 57 dB in CNR was obtained. Then, when a signal of 8 MHz was recorded by overwriting, there was obtained a read-out signal output of 32% in contrast ratio, 55 dB in CNR and 26 dB in erasion ratio.

The recording layer 2 having the composition of $In_{17}Sb_{17}Se_{66}$ in the disk B was markedly excellent in oxidation resistance and even when a test piece prepared by forming the recording layer 2 alone on a glass was left to stand for more than 2000 hours under the conditions of 60° C. and 95%RH, no change occurred in the reflectance of the medium to the regeneration light and the layer was hardly oxidized. Furthermore, when the disc B recorded as mentioned above was left to stand for more than 2000 hours under the conditions of 60° C. and 95%RH, no change was seen in the read-out signal output, namely, the contrast ratio of 32% and the CNR of 55 dB were maintained.

When a part of In in the In-Sb-Se recording layer 2 of the disk B was replaced with at least one of Sn, Ge, Pb, Si, Bi, Ga, Au, Ag and Cu and this disk B was used as reversible type and subjected to record/erase/read-out, the similar characteristics were also obtained. Of the above elements represented by D, In is the best in the record/erase/read-out characteristics as reversible type medium. Next, Sn and Ge are preferred among the Group IVb elements, Bi is preferred among the Groups IIIb and Vb elements, and Au is preferred among the Group Ib elements.

When Tl was used as the element of A in the disk B and the Tl content (w) was changed with keeping the relative ratio of other elements at constant, the erasion ratio in overwriting changed as shown in the following Table 12.

TABLE 12

|  | Erasion ratio |
| --- | --- |
| w = 0 | 26 dB |
| w = 2 | 28 |
| w = 5 | 30 |
| w = 10 | 32 |
| w = 15 | 32 |

However, in the case of the Tl content being higher than the above content, when the disk was left to stand under the conditions of 60° C. and 90%RH, the recording layer was oxidized within 1000 hours and reflectance of the medium to the reading beam decreased. The similar characteristics were also obtained when a part or the whole of Tl was replaced with at least one of halogen elements and alkali metal elements. Halogen elements preferred next to Tl is I and Cl is preferred next to I. Of the alkali metal elements, Na is preferred and K is next to Na.

When the rare earth element La was used as the element of A in the disk B and the La content (w) was changed with keeping the relative ratio of other elements at constant, the number of rewriting before the CNR decreased by 5 dB from the initial value in overwriting changed as shown in the following Table 13.

TABLE 13

|  | The number of rewriting (time) |
| --- | --- |
| w = 0 | 10,000 |
| w = 1 | 30,000 |
| w = 5 | 50,000 |
| w = 10 | 80,000 |
| w = 20 | 100,000 |
| w = 30 | 100,000 |

However, in the case of the La content being higher than the above content, the recording sensitivity decreased. Furthermore, when the disk was left to stand under the conditions of 60° C. and 90%RH, the recording layer was oxidized within 1000 hours and reflectance of the medium to the reading beam decreased. The similar characteristics were also obtained when a part or the whole of La was replaced with at least one of other rare earth elements such as Ce, Pr and Nd. Of these rare earth elements, La and Ce are preferred in that these elements are higher in oxidation resistance than other rare earth elements and the rewriting number can be much increased.

The disk prepared by providing a ZnS protective layer of 50 nm thick between the substrate 1 and the recording layer 2 of the disk B was improved in environmental resistance of the medium and this disk showed no change in the read-out signal output even after the disk was left to stand for more than 3000 hours under the conditions of 60° C. and 95%RH. A ZnS protective layer of 100 nm thick was also provided between the reflective layer 3 and the organic layer 4 of this disk and the resulting disk which had the inorganic protective layers on both sides of the information-recording carrier layer was improved in rewriting characteristics.

Nearly the same results were obtained when an oxide or a nitride such as $SiO_2$, SiO, $Y_2O_3$, $ZrO_2$, TaN, AlN or $Si_3N_4$, a sulfide such as $Sb_2S_3$, a fluoride such as $CeF_3$, amorphous Si, $TiB_2$, $B_4C$ or BC, a material having the composition close to these materials or a mixture of these materials was used in place of ZnS used as the protective layer. A laminated film comprising two or more layers of these materials is also effective for enhancing the protective strength. For example, in the case of the two layer structure comprising an $SiO_2$ layer of 100 nm thick and a ZnS layer of 50 nm thick which was positioned near to the information-recording carrier layer than the $SiO_2$ layer, especially the rewriting characteristics were superior.

The similar results were obtained when a polycarbonate resin sheet, a polyolefin resin sheet, an epoxy resin sheet or an acrylic resin sheet was used in place of the chemical-reinforced glass sheet of this example. Furthermore, the similar results were also obtained when a polycarbonate resin substrate, a polyolefin resin substrate, an epoxy resin substrate or an acrylic resin substrate on the surface of which irregularities such as a tracking guide and prepits for address were directly formed was used in place of the glass substrate on which an ultraviolet-curing resin layer was formed.

As explained above, according to the present invention, WORM type and reversible type information-recording media superior in record/read-out characteristics, high in recording sensitivity and excellent in long-term stability can be obtained at low cost.

What is claimed is:

1. An information-recording medium comprising a substrate, a recording layer provided on the substrate, said recording layer changing in atomic arrangement upon irradiation with a recording energy beam, and a reflective layer which is provided on the side of the recording layer reverse to the side irradiated with the recording energy beam, wherein said recording layer and said reflective layer are contiguous to each other and the recording layer has an average composition represented by the following formula:

$$A_wD_xSb_ySe_z$$

wherein w, x, y and z are in the range of $0 \leq w \leq 30$, $3 \leq x \leq 57$, $3 \leq y \leq 57$ and $40 \leq z \leq 90$ in atomic percent, D represents at least one element of Sn, In, Ge, Pb, Si, Bi, Ga and Au, and A represents at least one element other than Sb, Se and the elements represented by D; and wherein said recording layer has a thickness of 5 to 500 nm and said reflective layer has a thickness of 10 to 500 nm.

2. An information-recording medium according to claim 1, wherein D in the formula is Sn.

3. An information-recording medium according to claim 1, wherein D in the formula is In.

4. An information-recording medium according to claim 1, wherein the at least one element represented by A comprises at least one element other than Ge, Tl and rare earth elements and the total amount of A is 20 atomic % or less.

5. An information-recording medium according to claim 1, wherein the at least one element represented by A comprises at least Tl and the amount of Tl is 15 atomic % or less.

6. An information-recording medium according to claim 1, wherein A in the formula represents Te.

7. An information-recording medium according to claim 1, wherein the at least one element represented by A is at least one transition metal element other than the elements of Group Ib and total amount of A is 20 atm % or less.

8. An information-recording medium according to claim 1, wherein the at least one element represented by A is at least one rare earth element.

9. An information-recording medium according to claim 1, wherein light absorbance of the reflective layer is 20-70%.

10. An information-recording medium according to claim 1, wherein thermal conductivity of the reflective layer is 0.3 W/(cm.deg) or less at 273K.

11. An information-recording medium according to claim 1, wherein the reflective layer comprises a thin film having an average composition represented by the following formula:

$$E_hSb_iBi_j$$

wherein h, i and j are in the range of $0 \leq h \leq 30$, $35 \leq i \leq 95$ and $5 \leq j \leq 65$ in atomic % and E represents at least one element of metals, semi-metals or semiconductor elements other than Sb and Bi.

12. An information-recording medium according to claim 11, wherein E in the formula represents Sn.

13. An information-recording medium according to claim 11, wherein E in the formula represents Te.

14. An information-recording medium according to claim 11, wherein E in the formula represents Ge.

15. An information-recording medium according to claim 11, wherein E in the formula represents at least one transition metal element.

16. An information-recording medium comprising a substrate, a recording layer provided on the substrate, said recording layer changing in atomic arrangement upon irradiation with a recording energy beam, and a reflective layer which is provided on the side of the recording layer reverse to the side irradiated with the recording energy beam, wherein said recording layer and said reflective layer are contiguous to each other and diffusion of atoms from the recording layer to the reflective layer and/or from the reflective layer to the recording layer occurs upon irradiation with a recording energy beam, wherein said recording layer has an average composition represented by the following formula:

$$A_wD_xSb_ySe_z$$

wherein w, x, y and z are in the range of $0 \leq w \leq 30$, $3 \leq x \leq 57$, $3 \leq y \leq 57$ and $40 \leq z \leq 90$ in atomic percent, D represents at least one element of Sn, In, Ge, Pb, Si, Bi, Ga and Au, and A represent at least one element other than Sb, Se and the elements represented by D; and wherein said recording layer has a thickness of 5 to 500 nm and said reflective layer has a thickness of 10 to 500 nm.

17. An information-recording medium according to claim 16, wherein the element represented by A comprises at least one element other than Te, Tl and rare earth elements and total amount of A is 20 atomic % or less.

18. An information-recording medium according to claim 16, wherein the element represented by A comprises at least Tl and the amount of Tl is 15 atomic % or less.

19. An information-recording medium according to claim 16, wherein light absorbance of the reflective layer is 20-70%.

20. An information-recording medium according to claim 16, wherein thermal conductivity of the reflective layer is 0.3 W/(cm.deg) or less at 273K.

21. An information-recording medium according to claim 16, wherein the reflective layer comprises a thin film having an average composition represented by the following formula:

$$E_hSb_iBi_j$$

wherein h, i and j are in the range of $0 \leq h \leq 30$, $35 \leq i \leq 95$ and $5 \leq j \leq 65$ in atomic % and E represents at least one element of metals, semi-metals or semiconductor elements other than Sb and Bi.

22. An information-recording medium according to claim 22, wherein E in the formula represents Sn.

23. An information-recording medium according to claim 22, wherein E in the formula represents Te.

24. An information-recording medium according to claim 22, wherein E in the formula represents Ge.

25. An information-recording medium according to claim 23, wherein E in the formula represents at least one transition metal element.

* * * * *